(12) United States Patent
Lee et al.

(10) Patent No.: US 7,378,002 B2
(45) Date of Patent: May 27, 2008

(54) ALUMINUM SPUTTERING WHILE BIASING WAFER

(75) Inventors: Wei Ti Lee, San Jose, CA (US); Ted Guo, Palo Alto, CA (US); Sang-Ho Yu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 243 days.

(21) Appl. No.: 11/209,328

(22) Filed: Aug. 23, 2005

(65) Prior Publication Data

US 2007/0045103 A1 Mar. 1, 2007

(51) Int. Cl.
*C23C 14/35* (2006.01)
*H01L 21/44* (2006.01)

(52) U.S. Cl. .......................... 204/192.17; 204/192.15; 204/192.12; 438/688

(58) Field of Classification Search ........... 204/192.12, 204/192.15, 192.17, 298.09, 298.2; 438/688
See application file for complete search history.

(56) References Cited

U.S. PATENT DOCUMENTS

| | | | | |
|---|---|---|---|---|
| 4,756,810 A | * | 7/1988 | Lamont et al. | 204/192.3 |
| 4,994,162 A | * | 2/1991 | Armstrong et al. | 204/192.15 |
| 5,108,570 A | * | 4/1992 | Wang | 204/192.3 |
| 5,242,566 A | | 9/1993 | Parker | 204/298.2 |
| 5,320,728 A | | 6/1994 | Tepman | 204/192.12 |
| 5,658,828 A | * | 8/1997 | Lin et al. | 438/643 |
| 6,045,666 A | | 4/2000 | Satitpunwaycha et al. | 204/192.17 |
| 6,217,721 B1 | | 4/2001 | Xu et al. | 204/192.17 |
| 6,238,533 B1 | | 5/2001 | Satitpunwaycha et al. | 204/298.25 |
| 6,290,825 B1 | * | 9/2001 | Fu | 204/298.2 |
| 6,306,265 B1 | | 10/2001 | Fu et al. | 204/192.12 |

* cited by examiner

*Primary Examiner*—Rodney G McDonald
(74) *Attorney, Agent, or Firm*—Law Offices of Charles Guenzer (57) ABSTRACT

An aluminum sputtering process including RF biasing the wafer and a two-step aluminum fill process and apparatus used therefor to fill aluminum into a narrow via hole by sputtering under two distinctly different conditions, preferably in two different plasma sputter reactors. The first step includes sputtering a high fraction of ionized aluminum atoms onto a relatively cold wafer, e.g., held at less than 150° C., and relatively highly biased to attract aluminum atoms into the narrow holes and etch overhangs. The second step includes more neutral sputtering onto a relatively warm wafer, e.g. held at greater than 250° C., and substantially unbiased to provide a more isotropic and uniform aluminum flux. The magnetron scanned about the back of the aluminum target may be relatively small and unbalanced in the first step and relatively large and balanced in the second.

17 Claims, 4 Drawing Sheets

ALUMINUM SPUTTERING WHILE BIASING WAFER

FIELD OF THE INVENTION

The invention relates generally to deposition of materials by sputtering. In particular, the invention relates to a two-step aluminum sputtering process and apparatus used therefor.

BACKGROUND ART

Silicon integrated circuits continue to often use aluminum as the conductive material for vertical and horizontal interconnects in a multi-level metallization structure despite an increased emphasis on copper metallization for very advanced circuitry. The aluminum is most often deposited by magnetron sputtering. However, as the aspect ratio of vertical interconnects continues to increase, a geometry generally unfavorable for sputtering, aluminum sputtering faces increased challenges. Nonetheless, relatively conventional DC magnetron sputter reactors continue to be favored because of their simplicity, low cost, and long usage.

Figure 1:
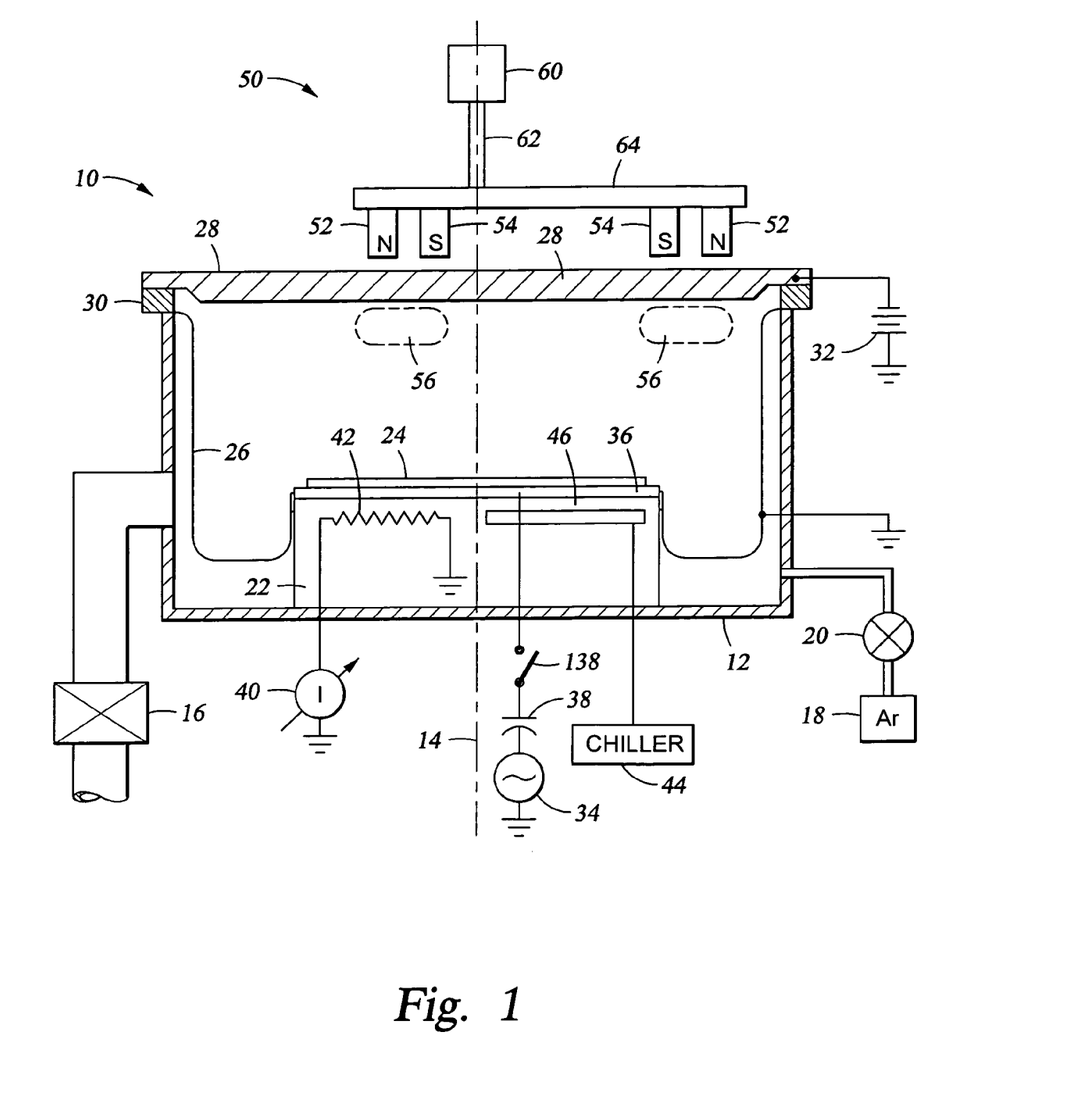
FIG. 1 is a schematic cross-sectional view of a generic sputtering reactor.

As schematically illustrated in the cross sectional view of FIG. 1, a DC magnetron sputter reactor 10 includes a vacuum chamber 12 arranged generally symmetrically about a central axis 14. A vacuum pump system 16 pumps the chamber 12 to a very low base pressure in the range of $10^{-8}$ Torr. However, a gas source 18 connected to the chamber through a mass flow controller 20 supplies argon as a sputter working gas. The argon pressure inside the chamber 12 is typically held in the low milliTorr range. A pedestal 22 arranged about the central axis 14 holds a wafer 24 or other substrate to be sputter coated. An unillustrated clamp ring or electrostatic chuck may be used to hold the wafer 24 to the pedestal 22, which is usually temperature controlled. A shield 26 protects the chamber walls and the sides of the pedestal 22 from sputter deposition. A target 28 having a planar front face is arranged in opposition to the pedestal 22 and has no substantial effective portion extending closer to the pedestal. For aluminum sputtering, at least the front face of the target 28 facing the wafer 24 is composed of aluminum or an aluminum alloy having no more than 10 at % of one or more alloying elements in addition to elemental aluminum. The target 28 is vacuum sealed to the chamber 12 through an isolator 30.

A DC power supply 32 electrically biases the target 28 negatively with respect to the shield 28, if electrically grounded, or other chamber part to cause the argon sputter working gas to discharge into a plasma such that the positively charged argon ions are attracted to the negatively biased target 28 and sputter material from it. Some of the sputtered material ejected from the target 28 is deposited as a layer on the wafer 24. In reactive ion sputtering, a reactive gas such as nitrogen is additionally admitted to the chamber to cause the deposition of a metal compound such as metal nitride. In some applications for sputtering copper or refractory barrier metals, an RF power source 34, for example operating at 13.56 MHz although other RF frequencies may be used, biases an electrode 36 in the pedestal 22 through a capacitive coupling circuit 38. In other applications including sputtering aluminum, the RF biasing circuitry is conventionally omitted and the pedestal 22 is left electrically floating.

Dependent upon the application, the wafer 24 may need to be heated or cooled during sputter coating. A controllable power supply 40 may supply current to a resistive heater 42 embedded in the pedestal 22 to thereby heat the wafer 24. On the other hand, a controllable chiller 44 may circulate chilled water or other refrigerant to a cooling channel 46 formed in the pedestal 22. Although unillustrated, further thermal control is effected by the controllable supply of argon thermal transfer gas delivered to a convolute channel formed in the top surface of the pedestal electrode 36 to thermally couple the wafer 24 to the pedestal 22.

The diode DC magnetron sputter reactor for aluminum sputtering conventionally does not include a RF inductive or microwave source of energy significantly coupling energy into the plasma.

The sputtering rate can be greatly increased by placing a magnetron 50 in back of the target 28. The magnetron 50, which is an aspect of the present invention, can assume various shapes and forms. It may include pairs of magnetic poles 52, 54 of opposed vertical magnetic polarity and typically arranged in a ring shape to form a ringshaped region 56 of a high-density plasma (HDP) adjacent the front face of the target 28. The HDP region 56 results from the magnetic field extending horizontally between neighboring magnetic poles 52, 54 trapping electrons, thereby increasing the plasma density. The increased plasma density greatly increases the sputtering of the adjacent region of the target 28. The plasma density is further increased by the magnetron 50 having an encompassing area significantly smaller than the area of the target being scanned and sputtered, for example, less than 15%, which thereby concentrates the target power in the reduced area of the magnetron 50. To provide a more uniform target sputtering pattern, the ring-shape magnetron 50 is typically offset from the central axis 14. A motor 60 drives a rotary shaft 62 extending along the central axis 14 and fixed to a plate 64 supporting the magnetic poles 52, 54 to rotate the magnetron 50 about the central axis 14. Rotating the offset magnetron 50 produces an azimuthally uniform time-averaged magnetic field. If the magnetic poles 52, 54 are formed by respective rings of opposed cylindrical permanent magnets, the plate 64 is advantageously formed of a magnetic material to serve as a magnetic yoke.

Magnetrons of several different designs have been applied to reactors of the general design illustrated in FIG. 1. Tepman describes in U.S. Pat. No. 5,320,728 a magnetron that has a flattened kidney shape. For example, as illustrated in the plan view of FIG. 2, a kidney-shaped magnetron 70 includes an outer pole 72 of one magnetic polarity surrounding an inner pole 74 of the other magnetic polarity. The two poles 72, 74 are typically formed of continuous bands of a soft magnetic stainless steel acting as pole pieces and underlaid by a plurality of permanent magnets. A gap 76 of nearly constant width separates the two poles 72, 74 and has periphery with a flattened kidney shape. The gap 76 defines an annular band in which the magnetic field between the two poles 72, 74 is approximately horizontal adjacent the sputtering face of the target 28. The kidney-shaped magnetron 70 is relatively large compared to the target 28, for example, having an encompassing area within the inner periphery of the outer pole 74 of greater than 25% of the total used area of the target, that is, the area scanned by the magnetron 70 and thereby sputtered. The rotation center 14 of the magnetron 70 typically falls on or near the inner portion of the inner pole 74. Parker illustrates several variations of the kidney-shaped magnetron in U.S. Pat. No. 5,242,566.

More recently, a self-ionizing plasma (SIP) sputtering process has been developed primarily for use in copper sputtering, as has been described by Fu et al. in U.S. Pat. No. 6,306,265, incorporated herein by reference in its entirety.

SIP sputtering relies upon high target power, high wafer biasing, and a relatively small unbalanced magnetron. The high target power and small magnetron produce a significant fraction of sputter atoms that are ionized, which the biased wafer accelerates and attracts deeply within narrow aspect-ratio holes. A typical SIP magnetron 80 is illustrated in schematic bottom plan view in FIG. 3, although other shapes are possible, including racetrack, circular, oval, and others. The SIP magnetron 80 includes a generally triangularly shaped outer pole 82 of one vertical magnetic polarity along the central axis 14. A curved side 84 of the outer pole 82 generally follows the adjacent outside periphery of the target 28. An apex 86 of the shaped outer pole 82 falls close to the rotational center 14 of the SIP magnetron 80. Typically, the rotational center 14 falls within the outer pole 82 or very close outwardly towards the curved side 84. The outer pole 82 surrounds a triangularly shaped inner pole 88 having a magnetic polarity opposite that of the outer pole 82 and separated from it by a nearly constant gap 90. The magnetic field produced between the two poles 82, 88 and extending horizontally in front creates the high-density plasma region 56 of FIG. 1 but a minimal central field-free core. An SIP magnetron is usually small, having an encompassing area within the inner periphery of the outer pole 84 of less than 20% of the used area of the target.

Figure 3:
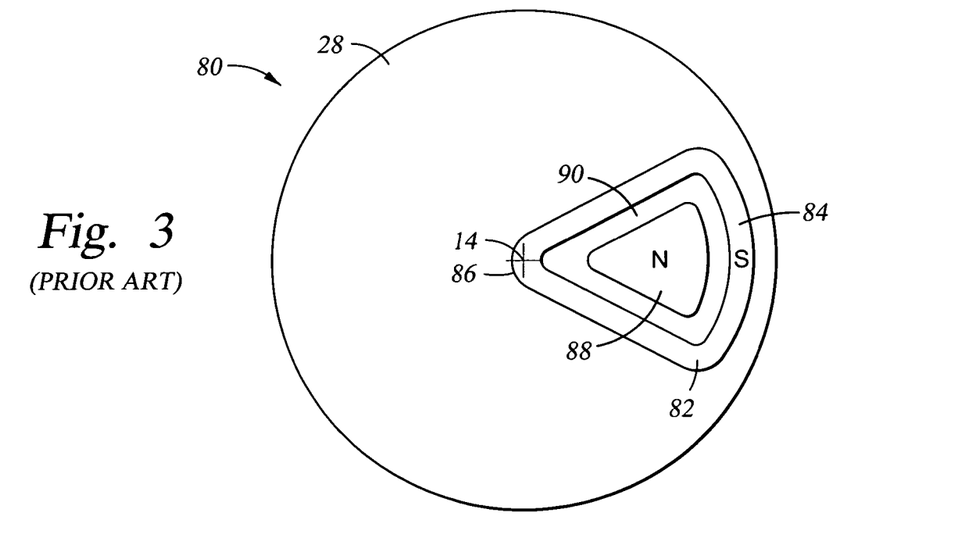
FIG. 3 is a bottom plan view of a conventional small unbalanced magnetron.

The SIP magnetron 80 is unbalanced in the meaning that the total magnetic intensity of the outer pole 82, that is, the magnetic flux integrated over the area of the outer pole 82, is substantially greater than that of the inner pole 82, for example by a factor of at least 150% and preferably 200% or 300%. Typically, the unbalance is achieved by placing beneath the two pole pieces acting as the inner and outer poles 82, 88 a different number of similarly constructed but oppositely oriented permanent cylindrical magnets, for example, of NdBFe. However, other structures have been proposed. The unbalance causes the unbalanced portion of the magnetic field to project from the magnetron 50 or 80 towards the wafer 24 of FIG. 1, thereby extending the plasma and guiding the ionized sputter atoms perpendicular to the wafer surface and deep into the deep via hole, particularly in a long-throw reactor.

Figure 4:
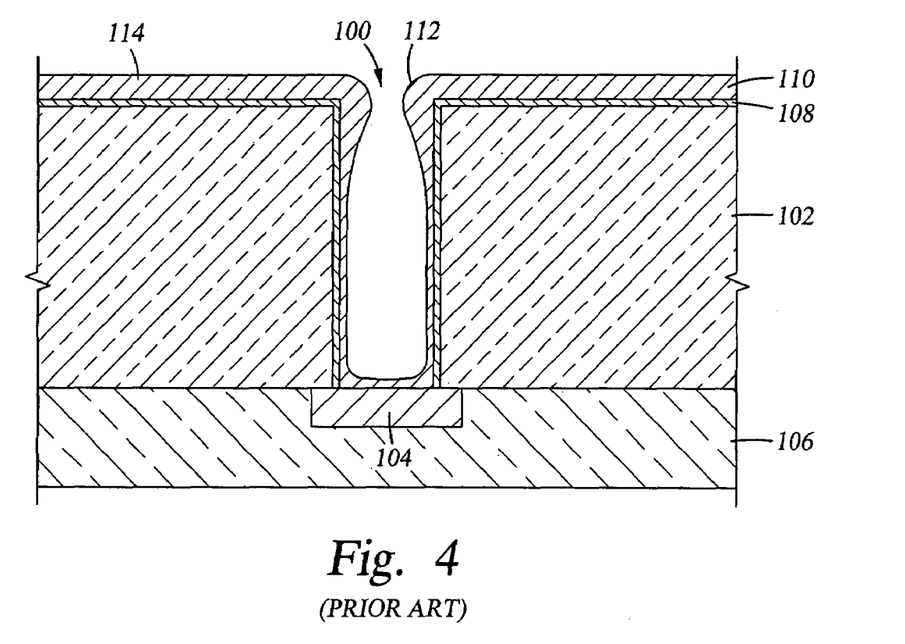
FIG. 4 is a cross-sectional view of a via hole being filled with aluminum according to the prior art.

Neither of the above sputtering methods seems adequate to fill aluminum into a high aspect-ratio via hole 100, illustrated in the cross-sectional view of FIG. 4, formed through an upper dielectric layer 102 overlying a conductive feature 104 in a lower dielectric layer 106. In advanced integrated circuits, the hole 100 may have an aspect ratio of its depth to width of four or more. A thin barrier layer 108 typically of Ti or TiN or a combination thereof is coated onto the sides of the via hole 100 before an aluminum layer 110 is sputter coated thereon. Preferably, the barrier layer 108 is removed from the bottom of the via hole 100 either by selective sputtering conditions or with a separate etching step, as is well known in the art.

A conventional aluminum sputter coating using the Tepman magnetron of FIG. 3 and an unbiased wafer, however produces a generally isotropic flux pattern of neutral sputter atoms unsuitable for filling high aspect-ratio holes. In particular, overhangs 112 tend to develop at the top corners of the via hole 100 and sidewall and bottom coverage is poor. In particular, the overhangs 112 may close the via hole 100 before the hole 100 is filled, thereby leaving a void in the aluminum fill. Such voids are almost impossible to remove and create great reliability problems.

One method of avoiding overhangs includes heating the wafer to a temperature of 300 to 500° C. or even higher during sputtering so that the aluminum reflows into the bottom of the via hole 100. Reflow however becomes increasingly ineffective with via holes 100 of increasing aspect ratio. Also, the reflowed aluminum does not wet well to uncoated surfaces of other materials. As a result, the aluminum tends to agglomerate within the via hole 100 rather than forming a smooth layer required for filling such narrow holes. One method of avoiding such agglomeration includes a two-step sputtering process in which a first sputter deposition step is performed with a relatively cool wafer so that the aluminum sticks to the oxide sidewalls and forms a thin first layer and a second sputter deposition is performed at a much higher temperature to flow over the first layer and fill the remaining portion of the hole. However, this technique practiced with conventional aluminum sputter reactors using a Tepman magnetron does not solve the problem of conformally coating the first layer into high aspect-ratio holes.

SIP sputtering is not typically used for aluminum sputtering. Even though it is likely to eliminate the overhangs and improve sidewall and bottom cover, it is felt that the small-size SIP magnetron creates significant radial non-uniformity in the thickness of a blanket portion 114 of the aluminum layer on the top surface of the dielectric layer 102. The blanket portion 114 is relatively thick so its deposition time needs to be minimized and its thickness made uniform for device reliability. SIP sputtering is considered insufficient for these objectives.

Accordingly, an aluminum sputtering deposition process is desired which can uniformly fill high aspect-ratio holes. Most preferably, the process would use only planar diode sputter reactors.

SUMMARY OF THE INVENTION

A broad aspect of the invention includes sputtering aluminum onto a substrate that is electrically biased and a substantial fraction of the sputtered aluminum atoms are ionized. The process is preferably performed with the substrate held at a low temperature, for example, less than 150° C. or preferably less than 100° C.

Aluminum is sputter deposited, for example, into a narrow via hole, by a two step process. In a first, seed step, a relatively thick aluminum seed layer is sputter deposited from an aluminum sputtering flux have a relatively high fraction of ionized sputter aluminum ions and the substrate is strongly biased to attract and accelerate the aluminum ions to it. During the first step, the substrate temperature is kept relatively low. In a second, fill step, a second layer, which can fill and overfill the hole for horizontal metallization, is sputter deposited with a more neutral aluminum flux, with a relatively unbiased wafer, and with the wafer substrate held at an elevated temperature to promote reflow into the via hole.

During the first step, the substrate bias should be high, for example, ranging between 1 and 700 W for a 200 mm circular wafer, preferably ranging between 100 and 500 W, more preferably between 250 and 300 W. The substrate temperature should be low, for example, below 150° C. and preferably less than 100° C. The first step should be performed with a magnetron and chamber conditions favoring a high ionization fraction of sputtered aluminum atoms such that the bias draws the aluminum atom deep within narrow holes. The low temperature promotes adhesion to dielectric sidewalls.

During the subsequent second step, the substrate bias should be relatively low, for example, one tenth the power level of the first step and preferably the pedestal electrode is left electrically floating. During the second step, the substrate should be kept at a relatively high temperature to allow the aluminum to reflow into and fill the narrow hole. For example, the temperature of the substrate or the pedestal supporting it should be greater than 250° C. Preferably this temperature in the second step should be less than 550° C., preferably less than 450° C., and most preferably less than 400° C. Even a temperature of 350° C. effectively promotes reflow.

Both steps may be performed in the same sputter reactor by a proper adjustment of target and bias powers. However, it is preferred that the two steps be performed in two reactors, for example, connected to a common vacuum transfer chamber. The first reactor preferably includes substrate cooling and a small unbalanced magnetron rotating about the target center and producing in combination with high target power a high ionization fraction. The second reactor preferably includes substrate heating and a large magnetron which may be balanced. The large magnetron may also be rotated about the wafer center. The second reactor arrangement may be used to produce a neutral but more radially uniform aluminum flux.

The blanket thickness of the seed layer relative to the fill layer measured on the top planar surface should be less than that of the fill layer and preferably no more than half thereof. However, it has been found that a seed layer having a blanket thickness of at least one-quarter the fill thickness is commercially effective.

DETAILED DESCRIPTION OF THE PREFERRED EMBODIMENTS

Figure 5:
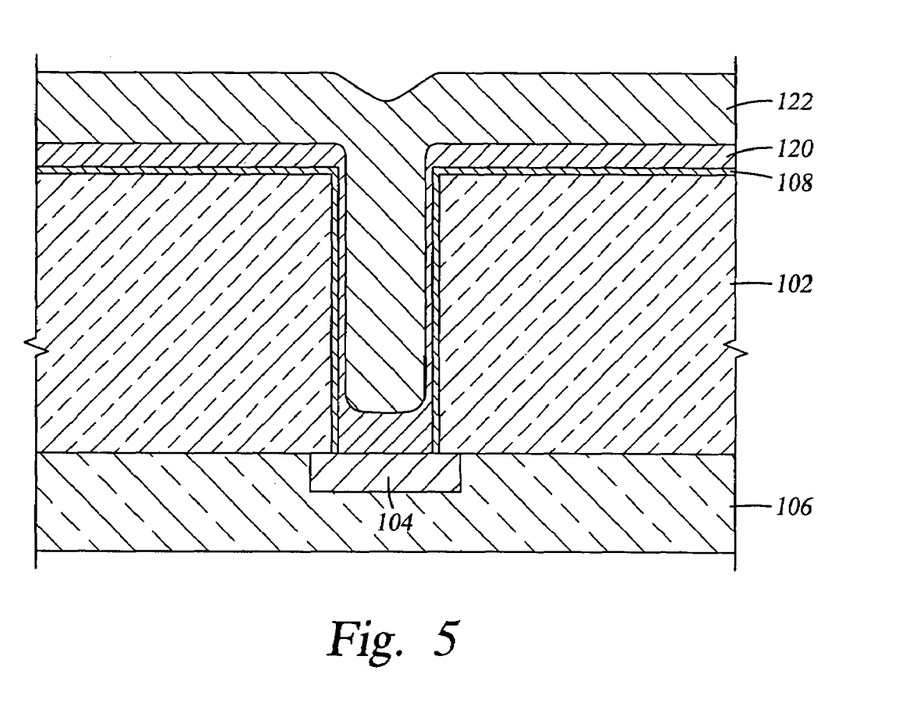
FIG. 5 is a cross-sectional view of a via hole being filled with a two-step sputtering operation according to one embodiment of the invention.

In one aspect of the invention and, illustrated in the cross-sectional view of an aluminum metallization structure in FIG. 5, an aluminum sputter fill process is divided into the sputter deposition of a thin aluminum seed layer 120 and a subsequent sputter deposition of a thicker aluminum fill layer 122. The deposition of these two different layers 120, 122 having significantly different characteristics is achieved by a significant change of the sputtering conditions between the two steps.

A broad aspect of the invention includes a cold, biased sputter deposition process for depositing aluminum, for example, to form the thin, nearly conformal seed layer 120 deep within a narrow hole while the wafer 24 is biased negatively to draw ionized aluminum sputter atoms deep within the hole and also while the wafer 24 is maintained at a relatively low temperature so that the aluminum sputter atoms stick to the barrier layer 108 on the hole sidewalls.

The cold, biased aluminum sputter process may form the first step of a two-step aluminum sputter deposition process. As illustrated in the process diagram of FIG. 6, a first, cold seed step 130 sputter deposits the thin aluminum seed layer in a sputter process producing a substantial fraction of ionized aluminum sputter atoms.

Figure 6:
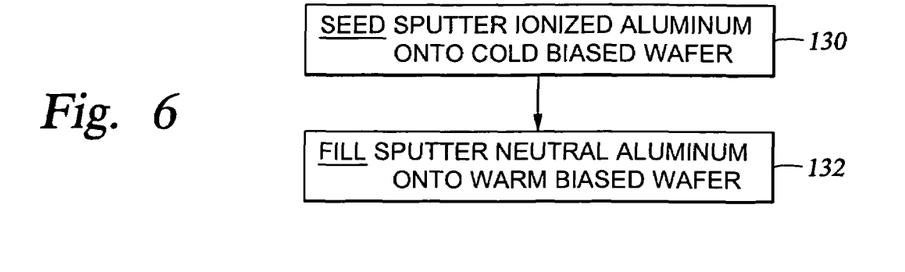
FIG. 6 is a flow diagram of a aluminum fill process according to one embodiment of the invention.

In step 130, the sputter reactor is operated to produce a relatively high fraction of ionized aluminum sputter ions and the wafer is biased so that the aluminum ions are drawn deep within the via hole to increase the bottom and sidewall coverage. A strong wafer bias further promotes selective etching by either the aluminum ions or the ionized argon sputtering of the aluminum exposed at the corners at the top of the via hole because of the exposed geometry. The corner selectivity reduces the formation of the overhangs. The biasing also tends to etch the exposed top planar portion, thereby reducing the blanket deposition rate relative to the sidewall coverage within the via hole. The pedestal is advantageously electrically biased with RF power in the range of 1 to 700 W for an area normalized to a 200 mm circular wafer. However, a preferred bias power range is 100 to 500 W. A more preferred range is 100 to 300 W.

Further, the wafer is kept relatively cold during the first step 130 so that the seed aluminum more readily sticks to the surfaces on it strikes. In general, sputtering near room temperature is effective. Pedestal temperatures down to about −40° C. are sometimes used. The temperature should be kept below 150° C., and preferably below 100° C.

There are several techniques available to achieve the high ionization fractions needed in the first, cold seed step. However, an effective and cost-effective process is achieved using the planar diode reactor 10 of FIG. 1 in conjunction with a small, unbalanced magnetron, for example, the SIP magnetron 80 of FIG. 2, in conjunction with relatively high levels of DC power applied to the target 28. The small size of the magnetron 80 concentrates the target power to a small area, thus increasing the density of the plasma. The high density of plasma allows the chamber pressure to be reduced since there is some self-ionized plasma sputtering of the aluminum target and the reduced pressure decreases scatting and neutralization of the aluminum ions. No inductive coil is required to support the plasma. The distance between the target 28 and the pedestal 22 may be increased to accommodate the size of the plasma region 56. That is, the reactor may be characterized as being long throw. The pedestal heating elements 40, 42 may be eliminated since pedestal heating is typically not required, but rather pedestal cooling is more typically required.

A typical blanket thickness of the aluminum seed layer 120 deposited according to these conditions is about 200 nm as measured on the top planar surface. This relatively thick layer provides substantial bottom coverage and sidewall coverage adequate to seed the subsequently deposited warm aluminum.

Other sputtering techniques are available to produce high ionization fractions. Additional RF power can be coupled into the plasma source region through an inductive coil wrapped around the chamber in a process often called Ion Metal Plating (IMP). However, IMP generally requires a high argon pressure, which produces a hot process contrary to the needs of the cold, first step. More complexly shaped targets have been used to produce high ionization pressures at low chamber pressure. For example, the target may have a vault facing the wafer in the form of a right circular cylinder in a technology called hollow-cathode magnetron, or the vault may form an annular ring in a technology called self-ionizing plasma Plus (SIP+). Although such sputter reactors with shaped aluminum targets are expected to provide superior results for the cold, first step, such shaped targets are expensive, particularly in view of the relatively thick seed layers contemplated here. In contrast, the planar target 28 of FIG. 1 has a conventional shape and is readily available at reasonable cost. The use of a small SIP magnetron introduces little cost or complexity and allows an otherwise generally conventional reactor to form a SIP reactor capable of sputtering requisite levels of ionized aluminum.

A second, warm fill step 132 of FIG. 6 sputter deposits the thicker aluminum fill layer 122. Aluminum ionization and wafer biasing are not crucial in the second step 132 so that the sputter process may produce a mostly neutral flux of aluminum sputter atoms. The wafer may be left unbiased or electrically floating although some DC self-bias may still develop. As a result, the sputtered aluminum assumes a more nearly isotropic distribution, for example, having the cosine distribution typical of neutral sputtering. In the absence of a large plasma region, the distance between the target 28 and the pedestal 22 may be reduced from that of the chamber used in the first step 130. As a result, the sputtering uniformity across the wafer is generally quite good even though coverage inside a deep via hole is reduced. It is understood that a substantially unbiased pedestal electrode in the second step includes one to which is applied less than 10% of the power applied in the first step. Additionally, the wafer is held at a warm temperature during the second step 132 so that the aluminum tends to reflow into the via hole over the aluminum seed layer and fill the hole. The presence of the continuous aluminum seed layer promotes the reflow so that the wafer temperature can be kept relatively low, for example, less than 550° C., more preferably less than 450° C., and most preferably less than 400° C. Even temperatures as low as 250° C. promote aluminum reflow during the second step. In contrast, a standard one-step reflow temperature often exceeds 600° C. or 625° C. Processing of advanced integrated circuits requires a reduced thermal budget so elevated temperatures during extended periods should be avoided.

It is possible to also use the same SIP reactor for the second sputter deposition step 132 by toggling a switch 138 of FIG. 1 to disconnect the RF power supply 34 from the pedestal 22 or alternatively by reducing the amount of RF power delivered to the pedestal 22. The ionization fraction can be reduced by reducing the DC power supplied to the target 28. However, this solution is not considered to be optimum. The small SIP magnetron does not produce the desired uniformity particularly in a short-throw sputter reactor, and the sputtering rate at reduced target power is felt to be too low. Also, the pedestal needs to heat up from the first, cold step 130 before the second, warm step 132 can effectively commence.

Figure 2:
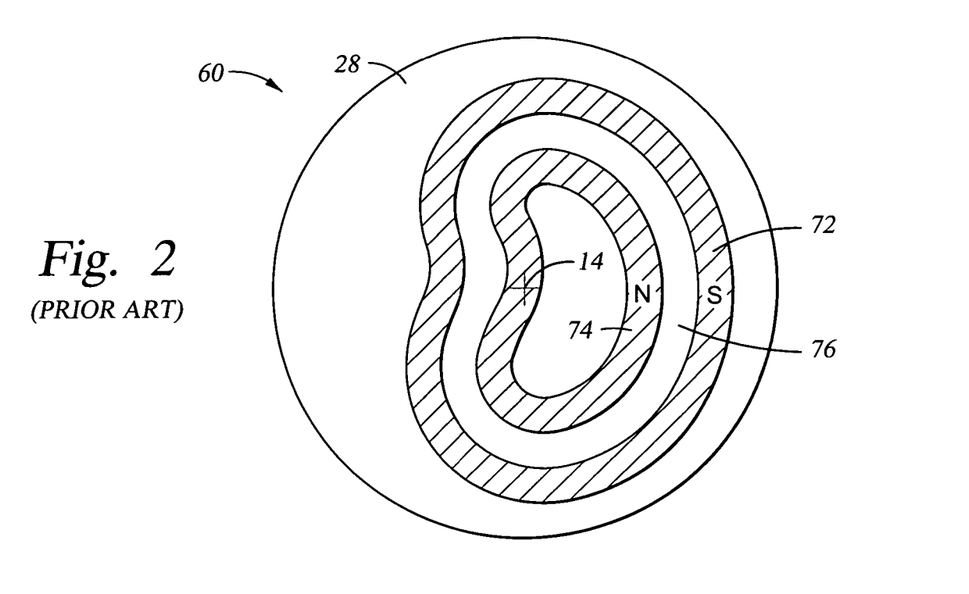
FIG. 2 is a bottom plan view of a conventional large balanced magnetron.

Instead, in many commercial applications, it is generally preferred to use, in addition to the first SIP sputter reactor, a second sputter reactor, also of the general configuration of the reactor 10 of FIG. 2 in conjunction with a larger, more balanced magnetron, such as the Tepman magnetron 70 of FIG. 2. The second reactor does not need an RF power supply to bias the wafer pedestal and it may omit the pedestal chiller 44 in favor of the pedestal heater 40, 42. It is understood that an electrically floating pedestal will develop some negative DC bias. A typical blanket thickness of the aluminum fill layer 122 deposited according to these conditions is about 500 nm as measured on the top planar surface. This thickness under warm conditions fills the hole and provides sufficient blanket thickness to allow the aluminum above the dielectric layer 102 to be patterned in horizontal connections. The blanket thickness of the fill layer is preferably should be greater than that of the seed layer and is preferably at least twice the thickness.

As a result, it is preferred that two different types of planar magnetron sputter reactors be used in filling aluminum, one with a small unbalanced magnetron, the other with a larger more balanced magnetron among other possible differences. An integrated platform 140 for such a process is schematically illustrated in the plan view of FIG. 7. It is commercially available from Applied Materials, Inc. of Santa Clara, Calif. as the Endura system. It includes first and second transfer chambers 142, 144, containing therein respective first and second robots 146, 148 for moving wafers between various stations arranged about the chamber peripheries.

Figure 7:
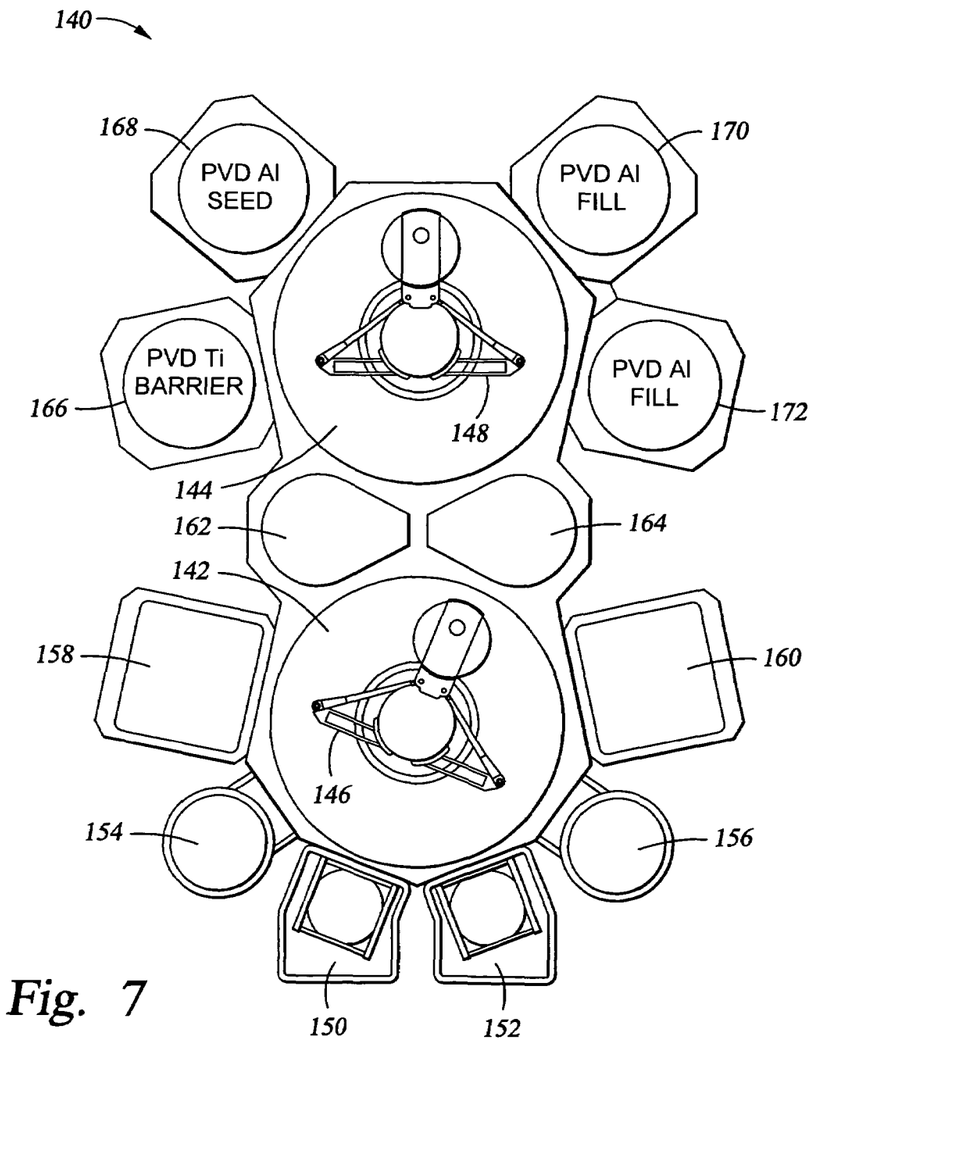
FIG. 7 is a schematic plan illustration of an integrated platform including multiple aluminum sputtering reactors of different designs.

The first transfer chamber 142 is vacuum pumped to a moderately low pressure, for example, about 1 milliTorr, while the second transfer chamber 144 is pumped to a much lower pressure, for example, 1 microTorr. The first robot moves wafers into and out of the system to and from cassettes loaded into load lock chambers 150, 152 selectively isolated from both the first transfer chamber 146 by slit valves and from the exterior by vacuum doors through which the wafer-containing cassettes are loaded and unloaded. More complex loading arrangements are available. Various processing chambers 154, 156, 158, 160 are arranged around the periphery of the first transfer chamber 142 and, if active processing is done in the chamber, respective slit valves are disposed therebetween. If the platform is dedicated to sputtering, the chambers around the first transfer chamber 142 typically perform different types of pre-processing other than sputtering, such as degassing, orienting, and pre-cleaning. It is alternatively possible to perform on the same platform both etching and subsequent sputtering deposition into the etched structure. In this case, a plasma etch reactor and a plasma asher may be coupled to the first transfer chamber 142 to etch the dielectric through a patterned photomask and then remove the mask.

The robots 146, 148 move wafers between the two transfer chambers 142, 144 through double-gated pass-through chambers 162, 164 which provide the vacuum isolation between the two transfer chambers 146, 148. In some configurations, a pre-clean, cool down, or other operation may be performed while the wafer temporarily resides in one of the pass-through chambers 162, 164.

The second transfer chamber 144 is typically dedicated to sputter deposition and other operations requiring high vacuum, so as to not oxidize the deposited films between layers, and producing low contamination. All the sputter reactors associated with the second transfer chamber 144 are separated from it by respective slit valves. In one practice of the invention, a barrier sputter reactor 166 deposits a barrier layer. For aluminum metallization, the barrier layer is typically composed of Ti or TiN or a bilayer of the two materials. Both Ti or TiN can be deposited in the barrier sputter reactor 166 fit with a titanium target and generally having the configuration of the reactor 10 of FIG. 1. If titanium nitride is desired to be deposited, nitrogen is admitted into the barrier sputter reactor 166 while the titanium target is being sputtered. Other known barrier materials, typically composed of a refractory metal or nitride thereof, e.g., Ta, TaN, W, WN, and silicides thereof may be deposited in the barrier sputter reactor 166 fit with a target of the refractory metal.

An aluminum seed sputter reactor 168 is also coupled to the second transfer chamber 144. As previous described, the seed sputter reactor 168 is capable of sputter depositing aluminum onto a cold biased wafer from an aluminum target. A large fraction of the sputtered aluminum atoms are ionized, as is made possible by a small nested magnetron. An unbalanced magnetron is further effective at guiding the sputtered ions to the wafer.

A first aluminum fill sputter reactor 170 and advantageously a second aluminum fill sputter reactor 172 are also coupled to the second transfer chamber 144. The two fill sputter reactors 170, 172 may be of the same design and be operated identically. The replication is useful because the fill deposition typically takes much longer than the barrier and seed depositions. As a result, a single barrier reactor 166 and single seed reactor 168 may alternately feed two fill reactors 170, 172. As discussed previously, each of the aluminum fill sputter reactors 170, 172 has an aluminum target and are capable of sputter depositing aluminum onto a heated wafer. The wafer for the fill deposition need not be biased and the ionization fraction may be low. Accordingly, a large balanced magnetron may be used to promote uniform deposition.

The second robot 148 performs the wafer transfer from one of the pass-through chambers 162, 164, first to the barrier sputter reactor 166, then to the aluminum seed reactor 168, then alternately to one of the aluminum fill reactors, 170, 172, and finally returning the wafer preferably to the other of the pass-through chambers 162, 164.

Other integrated sputtering platforms are available in which the pressure within the transfer chamber linking all the sputtering operations is maintained below a microTorr or an in-line system may convey the wafer in a one-directional path between serially connected sputter reactors.

The invention thus provides an economical and effective method of filling aluminum into narrow holes consistent with presently available technology.

The invention claimed is:

1. A method of sputtering aluminum onto a substrate, comprising:
  a first deposition step performed in a first plasma sputter reactor fit with a first aluminum target facing an interior of the first reactor, the first step including supporting the substrate on a first pedestal within the reactor,
    biasing the pedestal with RF power having an RF power level of between 1 and 700 W normalized to an area of a 200 mm diameter circular substrate,
    maintaining the substrate at a first temperature of less than 150° C.,
    rotating about a central axis of the first aluminum target a first magnetron,
    admitting a sputter working gas into the first reactor,
    applying DC power to the first aluminum target to thereby sputter the first aluminum target to form a first aluminum layer on the substrate, the aluminum being formed to a first thickness on a top planar surface of the substrate; and
  a second deposition step performed in a second plasma sputter reactor fit with a second target having an aluminum front surface facing an interior of the second reactor, the second step including
    supporting the substrate on a second pedestal within the second reactor,
    maintaining the substrate at a second temperature of greater than 250° C.,
    rotating about a central axis of the second aluminum target a second magnetron producing a substantially different magnetic field distribution than the first magnetron,
    admitting a sputter working gas into the second reactor,
    applying DC power to the second aluminum target to thereby sputter the second target to form a second aluminum layer on top of the first aluminum layer on the substrate, the second aluminum layer being formed to a second thickness on the top planar surface of the substrate.

2. The process of claim 1, wherein neither of the first and second reactors includes an RF inductive coil used in the process.

3. The method of claim 1, wherein the first magnetron is unbalanced and has an encompassing area less than a first fractional area of the first target and wherein the second magnetron has an encompassing area that is a second fractional area of the second target.

4. The method of claim 3, wherein the second fractional area is greater than the first fractional area.

5. The method of claim 4, wherein the first fractional area is no more than 15% and the second fractional area is greater than 25%.

6. The method of claim 1, wherein the pedestal is left substantially unbiased during the second deposition step.

7. The method of claim 1, wherein the second temperature is between 250° C. and 550° C.

8. The method of claim 1, wherein the RF power level is between 100 and 500 W.

9. The method of claim 1, wherein the substrate includes a hole having an aspect ratio of at least four and the first and second deposition steps fill the hole.

10. The method of claim 1, wherein the first magnetron comprises
  an inner pole of a first magnetic polarity along the central axis of the first target and having a first total magnetic intensity, and
  an outer pole surrounding the inner pole of a second magnetic polarity opposite the first magnetic polarity and having a second total magnetic intensity at least 150% of the first total magnetic intensity.

11. The method of claim 1, wherein neither of the deposition steps includes inductively coupling RF power.

12. The method of claim 1, wherein during the second deposition, the substrate is either not biased or is biased with no more than 10% of the RF power applied in the biasing step during the first deposition step.

13. The method of claim 1, wherein the first and second deposition steps are performed in different sputter reactors connected through a vacuum transfer chamber to allow the substrate to be transferred between the different sputter reactors under vacuum.

14. The method of claim 1, wherein the RF power is applied at a power level between 100 and 500 W normalized to an area of a circular 200 mm substrate.

15. The method of claim 14, wherein the power level is between 100 and 300 W.

16. The method of claim 1, wherein the substrate is formed with a hole therein, wherein the first deposition step partially fills the hole, and wherein the second deposition step completely fills the hole.

17. A method of sputtering aluminum onto a substrate, comprising:
  a first deposition step performed in a first plasma sputter reactor fit with a first target having an aluminum front surface facing an interior of the first reactor, the first step including
    supporting the substrate on a first pedestal within the reactor, biasing the pedestal with RF power having an RF power level of between 1 and 700 W normalized to a 200 mm diameter of the substrate, maintaining the substrate at a first temperature of less than 150° C., rotating about a central axis of the first aluminum target a first magnetron comprising (1) an inner pole of a first magnetic polarity along the central axis of the first target and having a first total magnetic intensity, and (2) an outer pole surrounding the inner pole of a second magnetic polarity opposite the first magnetic polarity and having a second total magnetic intensity at least 150% of the first total magnetic intensity, admitting a sputter working gas into the first reactor, applying DC power to the first aluminum target to thereby sputter the first aluminum target to form a first aluminum layer on the substrate, the aluminum being formed to a first thickness on a top planar surface of the substrate; and a second deposition step performed in a second plasma sputter reactor fit with a second target having an aluminum front surface facing an interior of the second reactor, the second step including supporting the substrate on a second first pedestal within the reactor, the pedestal being left substantially unbiased, maintaining the substrate at a second temperature of greater than 250° C., rotating about a central axis of the first aluminum target a second substantially balanced magnetron, admitting a sputter working gas into the second reactor, applying DC power to the second aluminum target to thereby sputter the second target to form a second aluminum layer on top of the first aluminum layer on the substrate, the second aluminum layer being formed to a second thickness on the top planar surface of the substrate.

* * * * *